(12) United States Patent
Oshita et al.

(10) Patent No.: US 10,097,189 B2
(45) Date of Patent: *Oct. 9, 2018

(54) SEMICONDUCTOR DEVICE

(71) Applicant: RENESAS ELECTRONICS CORPORATION, Tokyo (JP)

(72) Inventors: Takeshi Oshita, Tokyo (JP); Takanori Hirota, Tokyo (JP); Masato Suzuki, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/494,681

(22) Filed: Apr. 24, 2017

(65) Prior Publication Data

US 2017/0230051 A1 Aug. 10, 2017

Related U.S. Application Data

(63) Continuation of application No. 14/967,006, filed on Dec. 11, 2015, now Pat. No. 9,666,265.

(30) Foreign Application Priority Data

Dec. 15, 2014 (JP) .................... 2014-252868

(51) Int. Cl.
| | | |
|---|---|---|
| *G11C 7/22* | (2006.01) | |
| *H03L 7/081* | (2006.01) | |
| *G11C 11/4076* | (2006.01) | |
| *H03K 3/037* | (2006.01) | |

(52) U.S. Cl.
CPC ........ *H03L 7/0812* (2013.01); *G11C 11/4076* (2013.01); *H03K 3/037* (2013.01)

(58) Field of Classification Search
CPC ....................................................... G11C 7/22

USPC .......................................................... 365/191
See application file for complete search history.

(56) References Cited

U.S. PATENT DOCUMENTS

| | | | |
|---|---|---|---|
| 5,973,525 A | 10/1999 | Fujii | |
| 6,292,040 B1 | 9/2001 | Iwamoto et al. | |
| 7,872,928 B2* | 1/2011 | Park .................. | G11C 29/14 |
| | | | 365/189.07 |
| 7,957,210 B2 | 6/2011 | Yamazaki | |
| 8,913,448 B2* | 12/2014 | Tamlyn ............. | G11C 29/022 |
| | | | 365/189.05 |
| 9,666,265 B2* | 5/2017 | Oshita .............. | G11C 11/4076 |
| 2004/0086002 A1 | 5/2004 | Dally et al. | |
| 2009/0164830 A1* | 6/2009 | Oh .................... | G06F 1/3203 |
| | | | 713/600 |

(Continued)

FOREIGN PATENT DOCUMENTS

| | | |
|---|---|---|
| JP | 09-121155 A | 5/1997 |
| JP | 11-110065 A | 4/1999 |

(Continued)

OTHER PUBLICATIONS

Non-Final Office Action dated Jul. 25, 2016, issued in U.S. Appl. No. 14/967,006.

(Continued)

*Primary Examiner* — Min Huang
(74) *Attorney, Agent, or Firm* — McDermott Will & Emery LLP

(57) ABSTRACT

A delay time is set only within the variable delay time of a clock driver and cannot be set longer than the variable delay time of the clock driver. A control circuit adjusts the delay amount of a variable delay circuit so as to synchronize a pulse phase after a first pulse outputted from a pulse generation circuit passes through the variable delay circuit N times and a second pulse outputted from the pulse generation circuit.

9 Claims, 14 Drawing Sheets

(56) References Cited

U.S. PATENT DOCUMENTS

| | | | |
|---|---|---|---|
| 2010/0157719 A1* | 6/2010 | King | G11C 7/1066 365/233.17 |
| 2011/0187427 A1* | 8/2011 | Kim | H03L 7/06 327/158 |
| 2011/0267120 A1 | 11/2011 | Ravi et al. | |
| 2011/0267123 A1* | 11/2011 | Lee | H03K 5/1565 327/175 |
| 2011/0291720 A1* | 12/2011 | Ku | H03L 7/0814 327/158 |
| 2013/0223179 A1* | 8/2013 | Na | H03L 7/18 365/233.1 |
| 2014/0016404 A1* | 1/2014 | Kim | G11C 11/165 365/158 |
| 2014/0119141 A1* | 5/2014 | Tamlyn | G11C 29/022 365/193 |
| 2015/0002196 A1* | 1/2015 | Takahashi | H03L 7/1972 327/158 |
| 2016/0013796 A1* | 1/2016 | Choi | H03L 7/0802 327/158 |

FOREIGN PATENT DOCUMENTS

| | | |
|---|---|---|
| JP | 11-127062 A | 5/1999 |
| JP | 2005-044854 A | 2/2005 |
| JP | 2009-130455 A | 6/2009 |
| WO | 2013/075121 A1 | 5/2013 |

OTHER PUBLICATIONS

Final Office Action dated Oct. 25, 2016, issued in U.S. Appl. No. 14/967,006.

Notice of Allowance dated Jan. 25, 2017, issued in U.S. Appl. No. 14/967,006.

Japanese Office Action issued in corresponding Japanese Patent Application No. 2014-252868, dated Jun. 12, 2018, with English Translation.

* cited by examiner

FIG. 15

|                 | SL   | SL2 | SL3 |
|-----------------|------|-----|-----|
| DATA WRITE      | *    | 1   | *   |
| DATA READ       | 0    | 1   | 1   |
| TDR MEASUREMENT | 0, 1 | 0   | 0   |

SEMICONDUCTOR DEVICE

CROSS-REFERENCE TO RELATED APPLICATIONS

This application is a Continuation of U.S. application Ser. No. 14/967,006 filed Dec. 11, 2015, which in turn claims the benefit of the disclosure of Japanese Patent Application No. 2014-252868 filed on Dec. 15, 2014. The specification, drawings and abstract of each is incorporated herein by reference in its entirety.

BACKGROUND

The present invention relates to a semiconductor device and concerns, for example, a semiconductor device having a DLL (Delay Locked Loop) circuit.

A conventionally known technique reduces the size of a circuit that generates a signal for controlling the operation timing of a semiconductor device.

For example, a clock tree circuit described in Japanese Patent Laid-Open No. 2005-44854 includes a first partial clock tree that distributes a clock through a first clock driver, and a second partial clock tree that distributes a clock through a second clock driver. Furthermore, the clock tree circuit includes a phase comparator that compares the phases of a first clock from the first partial clock tree and a second clock from the second partial clock tree, and a low-pass filter that receives the output of the phase comparator and converts the output into a direct current. At least one of the first and second clock drivers has a variable delay time. The clock tree circuit is configured to control the delay time of at least one of the first and second clock drivers with a delay time variable according to the output of the low-pass filter.

SUMMARY

In a system described in Japanese Patent Laid-Open No. 2005-44854, however, a delay time is set only within the variable delay time of the clock driver and cannot be set longer than the variable delay time of the clock driver.

Other problems and new features will become apparent from the description and accompanying drawings of the specification.

According to an embodiment of the present invention, a control circuit adjusts the delay amount of a variable delay circuit so as to synchronize a pulse phase after a first pulse outputted from a pulse generation circuit passes through the variable delay circuit N times and a second pulse outputted from the pulse generation circuit.

The embodiment of the present invention can reduce the circuit area.

BRIEF DESCRIPTION OF THE DRAWINGS

FIG. 15 shows a state of select signals SL, SL2, and SL3 during data writing, data reading, and TDR measurement.

DETAILED DESCRIPTION

Embodiments of the present invention will be described below with reference to the accompanying drawings.
[First Embodiment]

Figure 1:
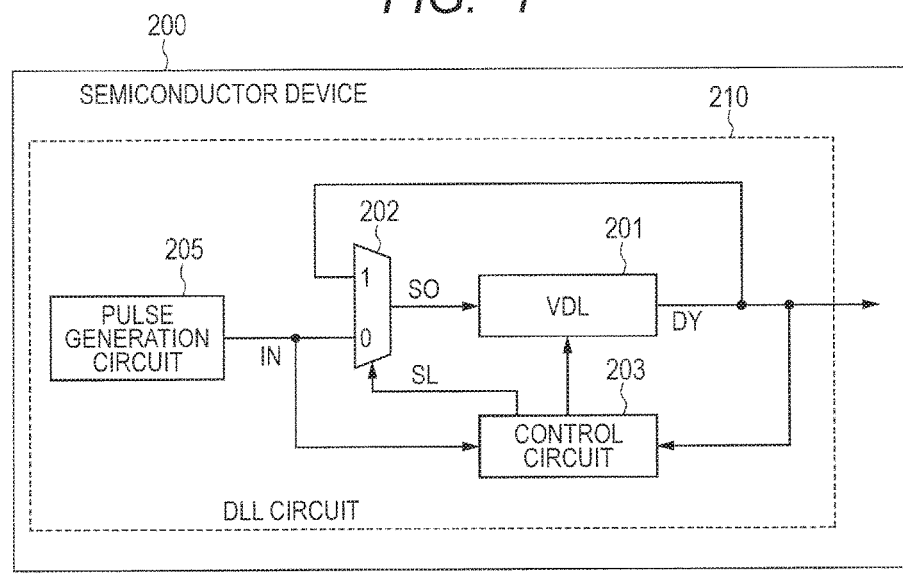
FIG. 1 shows the configuration of a semiconductor device according to a first embodiment.

FIG. 1 shows the configuration of a semiconductor device 200 according to a first embodiment.

As shown in FIG. 1, the semiconductor device 200 includes a DLL (Delay Locked Loop) circuit 210. The DLL circuit 210 includes a pulse generation circuit 205, a selector 202, and a variable delay circuit (VDL) 201, and a control circuit 203.

The pulse generation circuit 205 generates a pulse train with a constant period.

The variable delay circuit 201 delays an inputted pulse.

The selector 202 is provided in the previous stage of the variable delay circuit 201 and outputs one of a pulse outputted from the pulse generation circuit and an output pulse from the variable delay circuit 201 to the variable delay circuit 201.

The control circuit 203 controls the selector 202 and the variable delay circuit 201.

The control circuit 203 adjusts the delay amount of the variable delay circuit 201 so as to synchronize a pulse phase after a first pulse outputted from the pulse generation circuit passes through the variable delay circuit 201 N times and a second pulse outputted from the pulse generation circuit. The second pulse is a pulse generated at a time after the first pulse. N is a natural number not smaller than 2.

Figure 2:
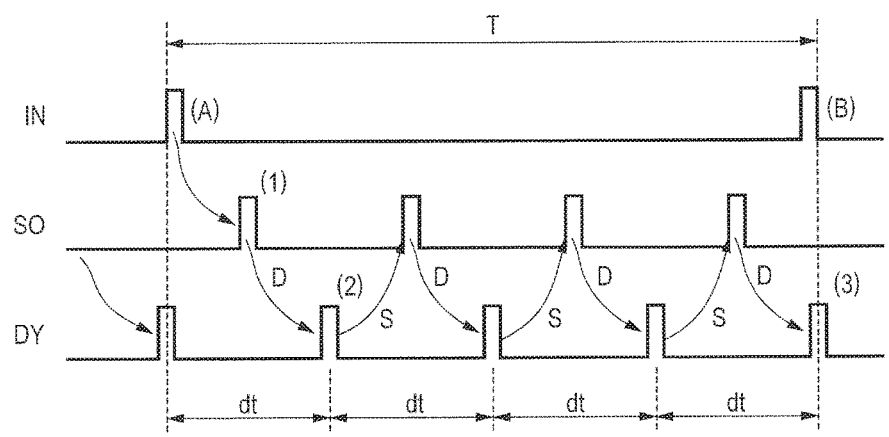
FIG. 2 is a timing chart showing the operations of the first embodiment.

FIG. 2 is a timing chart showing the operations of the first embodiment. In FIG. 2, N is 4.

The pulse generation circuit 205 outputs a first pulse IN (indicated at (A)).

The selector 202 allows the first pulse IN (indicated at (A)) outputted from the pulse generation circuit 205 to pass through the selector 202 four times.

In other words, the selector 202 selects the first pulse IN (indicated at (A)) outputted from the pulse generation circuit 205 and outputs a pulse SO (indicated at (1)). The variable delay circuit 201 delays the pulse SO, which is outputted from the selector 203, by a delay time D and outputs a delay pulse DY (indicated at (2)). After that, the selector 203 selects the delay pulse DY, which is outputted from the variable delay circuit 201, three consecutive times, and then the variable delay circuit 201 delays the pulse SO outputted from the selector 203 and outputs the delay pulse DY.

Subsequently, after a period T from the generation of the first pulse IN by the pulse generation circuit 205, a second pulse IN (indicated at (B)) is outputted.

The control circuit 203 repeats the processing while changing the delay amount of the variable delay circuit 201, until phase synchronization between the second pulse IN (indicated at (B)) and a pulse DY (indicated at (3)) after the first pulse IN passes through the variable delay circuit 201 four times.

In the case of phase synchronization between the second pulse IN (indicated at (B)) and the pulse DY (indicated at (3)) after the first pulse IN passes through the variable delay circuit 201 four times, the following equation is satisfied:

$$T=4\times dt \qquad (1)$$

where dt is the sum of a delay amount D of the variable delay circuit 201 and a time S for a selecting operation of the selector 202.

After the adjustment of the delay amount D of the variable delay circuit 201, the delay pulse DY outputted from the variable delay circuit 201 is delayed by T/4 from the pulse outputted from the pulse generation circuit 205. Thus, according to the present embodiment, the single variable delay circuit can generate a signal delayed by T/4 from a signal having the period T. This can reduce the circuit area and power consumption.

[Second Embodiment]

Figure 3:
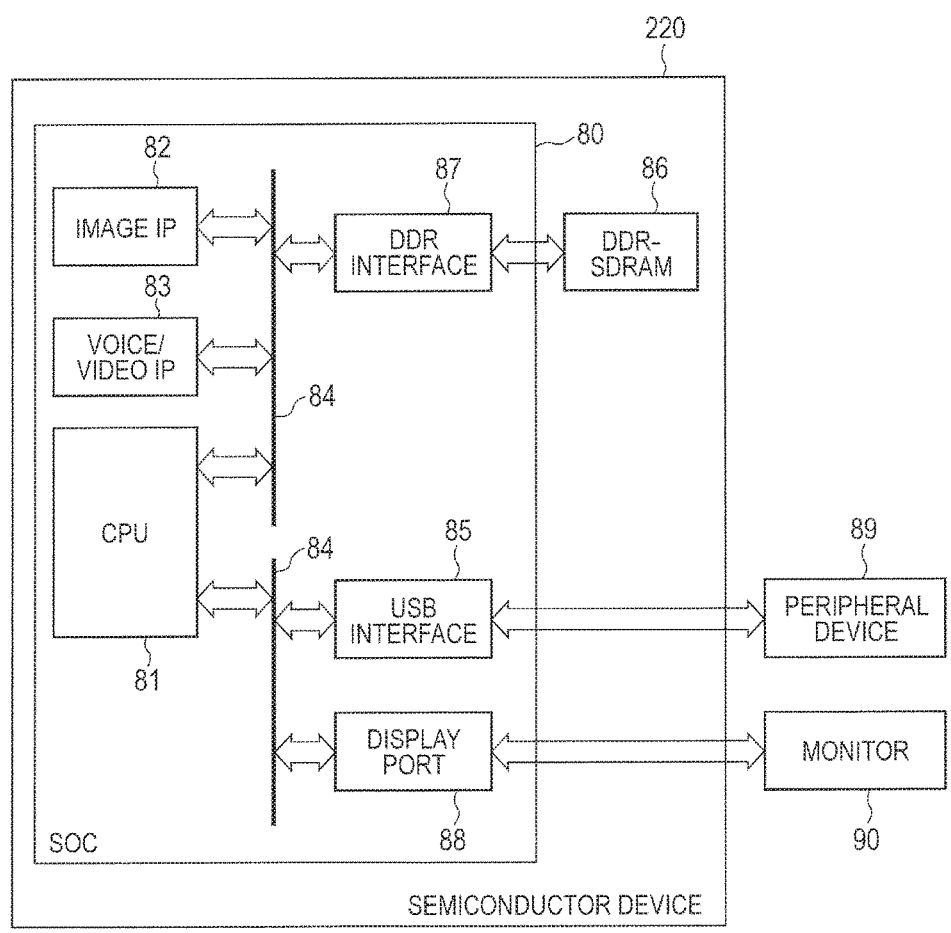
FIG. 3 shows the configuration of a semiconductor device according to a second embodiment.

FIG. 3 shows the configuration of a semiconductor device 220 according to a second embodiment.

The semiconductor device 220 includes an SOC (System-on-a-chip) 80 and a DDR-SDRAM (Double-Data-Rate Synchronous Dynamic Random Access Memory) 86.

The DDR-SDRAM 86 outputs (reads) and receives (writes) data both on the rising and falling edges of a synchronous clock.

The SOC 220 includes a CPU (Central Processing Unit) 81, an image IP 82, a voice/video IP 83, a DDR interface 87, a USB (Universal Serial Bus) interface 85, a display port 88, and a system bus 84.

The CPU 81 controls the overall semiconductor device 220. Moreover, the CPU 81 outputs write data to the DDR-SDRAM 86 and receives read data from the DDR-SDRAM 86.

The image IP 82 performs various kinds of processing on image data.

The voice/video IP 83 performs various kinds of processing on voice data and video data.

The DDR interface 87 controls transmission of read data and write data between the DDR-SDRAM 86 and the CPU 81.

The USB interface 85 is coupled to a peripheral device 89.

The display port 88 outputs an image signal to a monitor 90.

The system bus 84 is coupled to constituent elements in the SOC 80.

Figure 4:
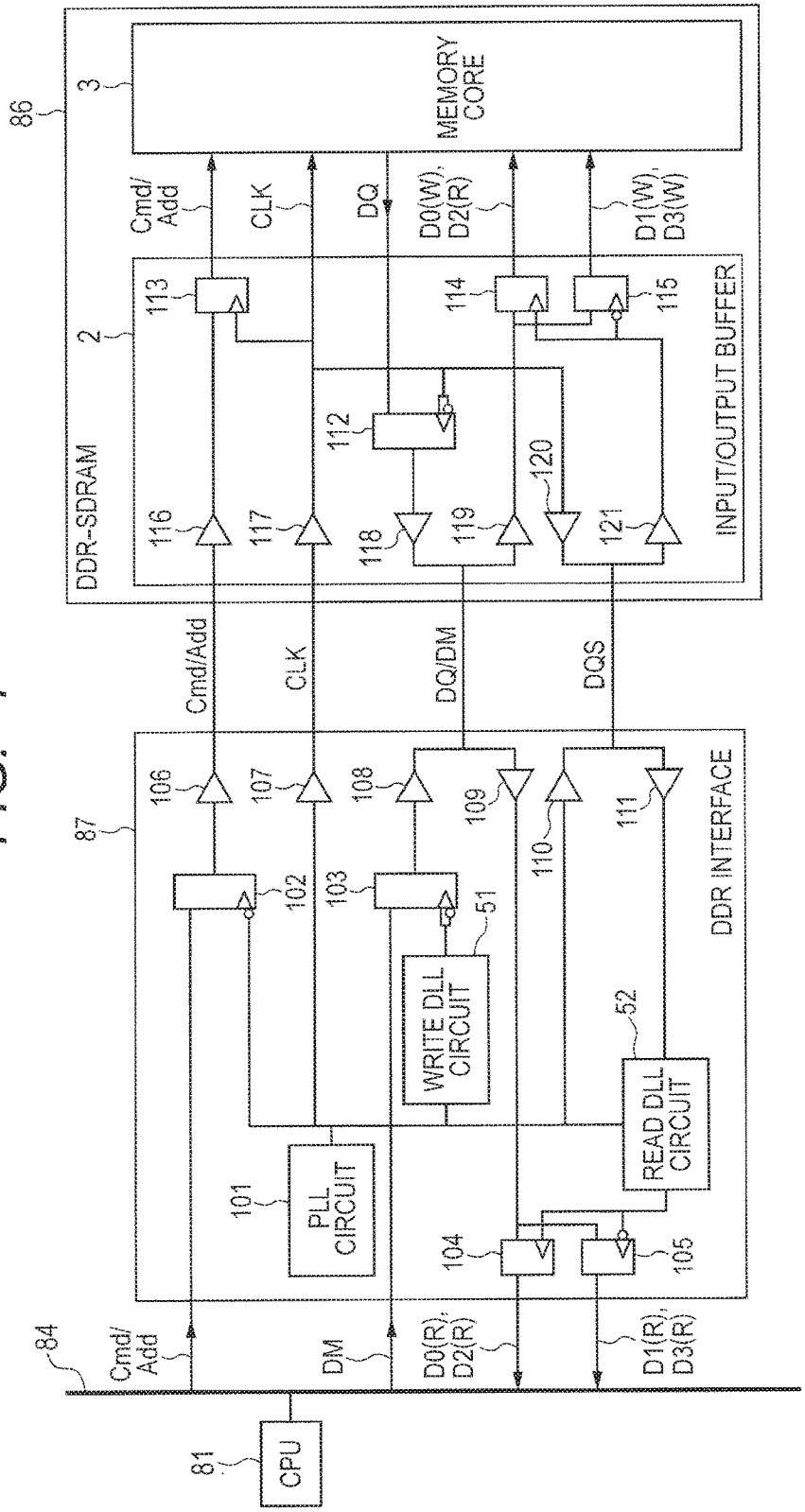
FIG. 4 shows the configuration of a DDR interface, the configuration of a DDR-SDRAM, and signals transmitted between the DDR interface and the DDR-SDRAM.

FIG. 4 shows the configuration of the DDR interface 87, the configuration of the DDR-SDRAM 86, and signals transmitted between the DDR interface 87 and the DDR-SDRAM 86.

The DDR interface 87 includes a PLL circuit 101, flip-flops 102 to 105, and buffers 106 to 111. The DDR-SDRAM 86 includes an input/output buffer 2 and a memory core 3. The input/output buffer 2 includes buffers 116 to 121 and flip-flops 112 to 115.

The PLL circuit 101 generates a clock CLK. The generated clock CLK is transmitted to the buffer 117 of the DDR-SDRAM 86 through the buffer 107.

The clock CLK is transmitted to the flip-flop 102, a write DLL circuit 51, and a read DLL circuit 52.

The flip-flop 102 latches a command Cmd or an address signal Add, which is outputted from the CPU 81, based on the inverted signal of the clock CLK and then outputs the command or signal to the buffer 116 of the SDRAM 86 through the buffer 106.

The write DLL circuit 51 delays the clock CLK by a predetermined time (a quarter of a clock period) and then outputs the clock CLK to the flip-flop 103.

The flip-flop 103 latches write data DM, which is outputted from the CPU 81, based on the delayed clock CLK, and then outputs the write data DM to the buffer 119 of the DDR-SDRAM 86 through the buffer 108.

The clock CLK is outputted as a data strobe signal DQS to the buffer 121 of the DDR-SDRAN 86 through the buffer 110.

The command Cmd or the address signal Add, the output of the buffer 116, is outputted to the flip-flop 113.

The clock CLK, the output of the buffer 117, is transmitted to the memory core 3 and is transmitted to the flip-flop 113, the flip-flop 112, and the buffer 120.

The data strobe signal DQS, the output of the buffer 121, is transmitted to the flip-flops 114 and 115.

The write data DM, the output of the buffer 119, is transmitted to the flip-flops 114 and 115.

The flip-flop 113 latches the command Cmd or the address signal Add according to the inputted clock CLK and then outputs the command or signal to the memory core 3.

The flip-flop 114 latches the write data DM according to the data strobe signal DQS and then outputs the data to the memory core 3.

The flip-flop 115 latches the write data DM according to the inverted signal of the inputted data strobe signal DQS and then outputs the data to the memory core 3.

The flip-flop 112 latches, according to the clock CLK, read data DQ outputted from the memory core 3 and then outputs the data to the buffer 118.

The buffer 118 outputs the read data DQ to the buffer 109 of the DDR interface 87.

The buffer 120 outputs the clock CLK as the data strobe signal DQS to the buffer 111 of the DDR interface 87.

The buffer 109 outputs the read data DQ to the flip-flops 104 and 105. The buffer 111 outputs the data strobe signal DQS to the read DLL circuit 52.

The read DLL circuit 52 delays the data strobe signal DQS by the predetermined time (a quarter of the clock period).

The flip-flop 104 latches the read data DQ according to the delayed data strobe signal DQS and then outputs the data to the CPU 81.

The flip-flop 105 latches the read data DQ according to the inverted signal of the delayed data strobe signal DQS and then outputs the data to the CPU 81.

Figure 5:
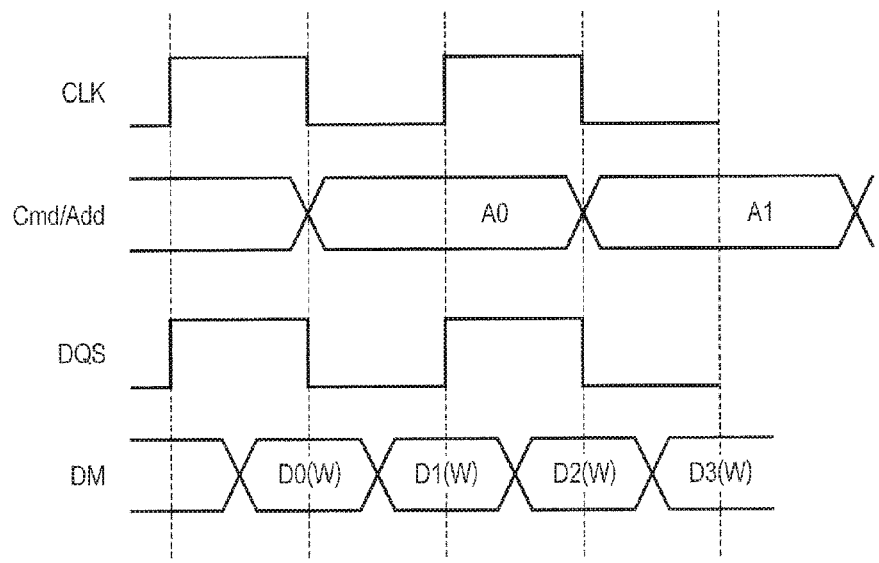
FIG. 5 is a timing chart of signals passing between the DDR interface and the DDR-SDRAM when data is written to the DDR-SDRAM.

FIG. 5 is a timing chart of the signals passing between the DDR interface 87 and the DDR-SDRAM 86 during writing of data to the DDR-SDRAM 86.

The command Cmd or the address signal Add that is transmitted from the DDR interface 87 to the DDR-SDRAM 86 is synchronized with a falling edge of the clock CLK transmitted from the DDR interface 87 to the DDR-SDRAM 86. This is because the flip-flop 102 latches the command Cmd or the address signal Add in synchronization with the falling edge of the clock CLK.

Moreover, the data strobe signal DQS transmitted from the DDR interface 87 to the DDR-SDRAM 86 is synchronized with the rising edge of the clock CLK. This is because the buffer 110 outputs the clock CLK as the data strobe signal DQS.

The write data DM transmitted from the DDR interface 87 to the DDR-SDRAM 86 is delayed by a quarter of a period T of the clock from the clock CLK with a period twice that of the clock CLK. This is because the write data DM is inputted from the CPU 81 to the DDR interface 87 with a period twice that of the clock CLK and the write DLL circuit 51 delays the write data DM by a time ($\pi/2$) corresponding to a quarter of the period T of the clock CLK.

Figure 6:
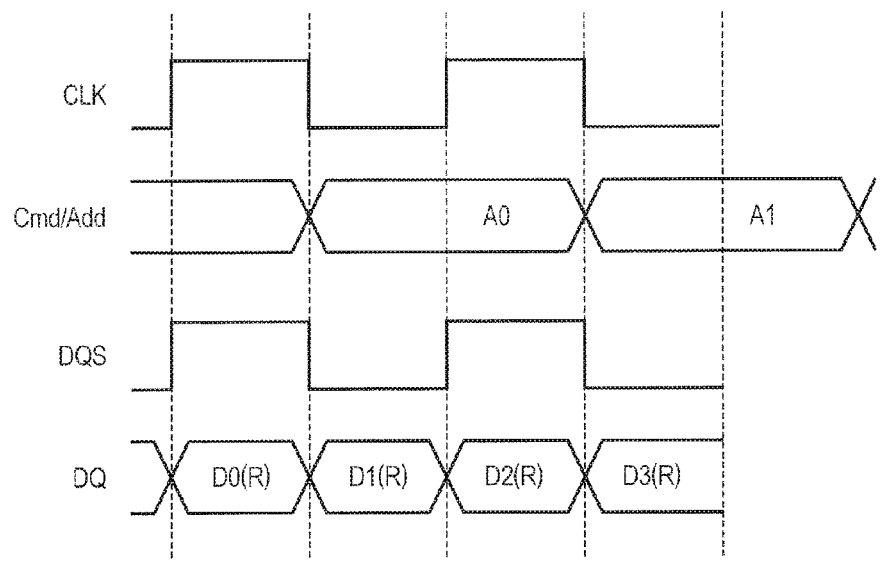
FIG. 6 is a timing chart of signals passing between the DDR-SDRAM and the DDR interface when data is read from the DDR-SDRAM.

FIG. 6 is a timing chart of the signals passing between the DDR-SDRAM 86 and the DDR interface 87 during reading of data from the DDR-SDRAM 86.

The command Cmd or the address signal Add that is transmitted from the DDR interface 87 to the DDR-SDRAM 86 is synchronized with the falling edge of the clock CLK transmitted from the DDR interface 87 to the DDR-SDRAM 86. This is because the flip-flop 102 latches the command Cmd or the address signal Add in synchronization with the falling edge of the clock CLK.

The data strobe signal DQS transmitted from the DDR-SDRAM 86 to the DDR interface 87 is synchronized with the rising edge of the clock CLK. This is because the buffer 120 outputs the clock CLK as the data strobe signal DQS.

The read data DQ transmitted from the DDR-SDRAM 86 to the DDR interface 87 has a period twice the period T of the clock CLK and is synchronized with the clock CLK. This is because the read data DQ is inputted from the memory core 3 to the flip-flop 112 with a period twice that of the clock CLK and then the flip-flop 112 latches the read data DQ according to the clock CLK.

The write DLL circuit 51 and the read DLL circuit 52 delay an inputted signal by a delay amount equivalent to a quarter of a clock period. In order to obtain the delay amount in the related art, it has been necessary to prepare four variable delay circuits with equally set delay amounts and adjust a variable delay circuit such that the sum of the delay amounts is equal to the clock period. The variable delay circuit is used because of a variable frequency of the clock CLK and the need for handling an environmental change, e.g., a temperature change. In the related art, however, the use of four variable delay circuits may increase the circuit area and power consumption.

In contrast, in the present embodiment, the signal is passed through the single variable delay circuit multiple times, setting the delay amount of the variable delay circuit at a quarter of the clock period. This can reduce the circuit area and power consumption.

Figure 7:
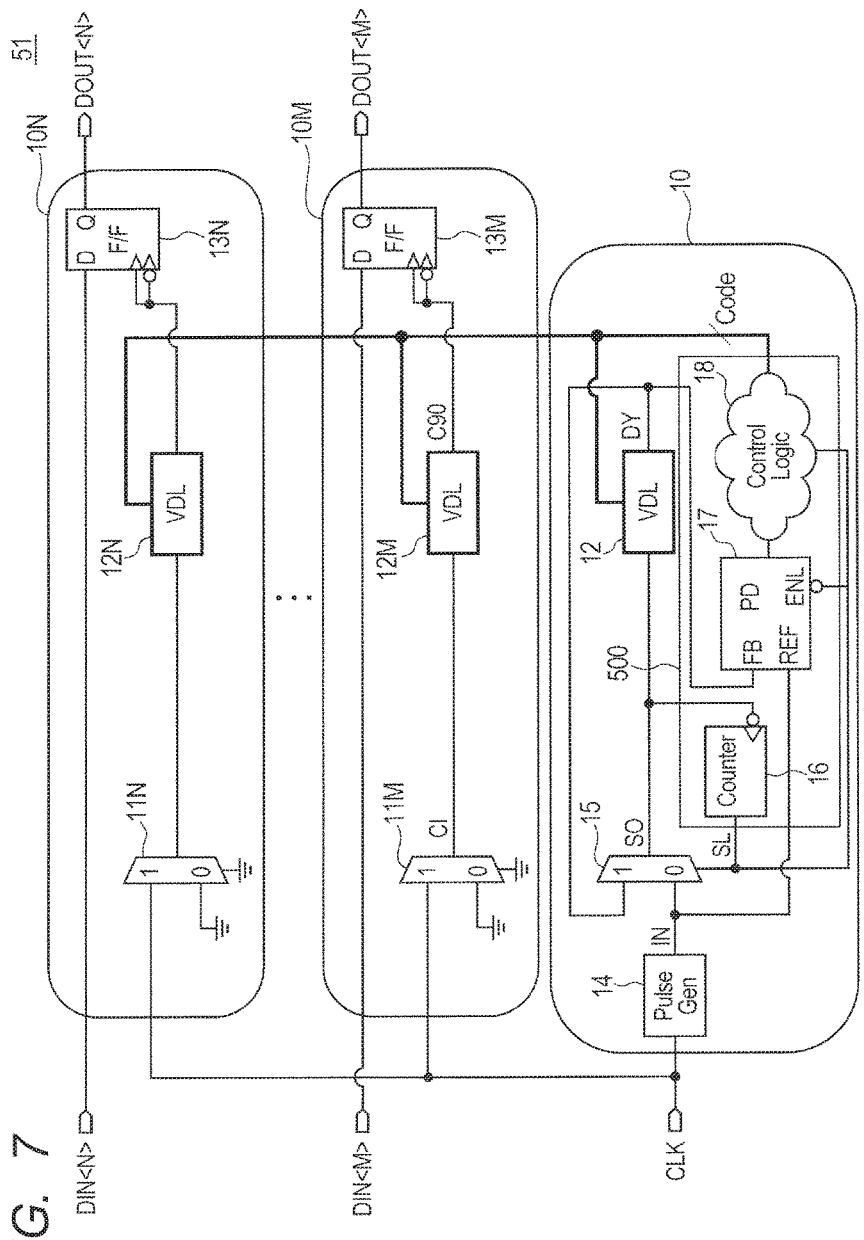
FIG. 7 shows the configuration of a write DLL circuit according to the second embodiment.

FIG. 7 shows the configuration of the write DLL circuit according to the second embodiment.

The write DLL circuit 51 includes a master DLL 10 and a plurality of data lanes.

In FIG. 7, the data lanes are typified by two data lanes 10M and 10N. The data lanes are also referred to as data output control circuits.

The data lanes 10M and 10N respectively include selectors 11M and 11N, VDLs 12M and 12N, and flip-flops 13M and 13N.

The selectors 11M and 11N each receive the clock CLK and a low-level signal and output one of the clock CLK and the signal. When data is written to the SDRAM, the selector 11M outputs the clock CLK. The output of the selector 11M will be designated as a reference clock CL.

The VDLs 12M and 12N delay signals outputted from the selectors 11M and 11N.

The delay amounts of the VDLs 12M and 12N are adjusted according to a control signal Code transmitted from a control logic 18 of the master DLL. The output of the VDL 12M will be designated as a clock C90 for the data lane M.

The flip-flops 13M and 13N latch input data DIN<M> and DIN<N> and then output the latched input data DIN<M> and DIN<N> on the rising and falling edges of signals outputted from the VDLs 12M and 12N.

The master DLL 10 includes a pulse generator 14, a selector 15, a control circuit 500, and a VDL 12. The control circuit 500 includes a counter 16, a phase comparator 17, and the control logic 18.

The pulse generator 13 generates a pulse IN from the rising edge of the clock CLK.

The selector 15 outputs, as a pulse SO, the pulse IN and a delay pulse DY outputted from the VDL 12. When a select signal SL outputted from the counter 16 is set at a low level, the selector 15 outputs the pulse IN of the two inputted signals as the pulse SO. When the select signal SL outputted from the counter 16 is set at a high level, the selector 15 outputs the delay pulse DY of the two inputted signals as the pulse SO.

The VDL 12 delays the pulse SO outputted from the selector 15 and outputs the delay pulse DY. The delay amount of the VDL 12 is adjusted according to the control signal Code outputted from the control logic 18.

The pulse SO is inputted to the counter 16. The counter 16 updates a count value CN on each falling edge of the pulse SO. The count value CN ranges from 0 to 3. When the count value CN is 0, 1, or 2, the counter 16 sets the select signal SL at a high level. When the count value CN is 3, the counter 16 sets the select signal SL at a low level.

The phase comparator 17 outputs a signal indicating a phase difference between the pulse IN and the delay pulse DY.

When the select signal SL is set at a low level, the control logic 18 outputs the control signal Code such that a phase difference between the pulse IN and the delay pulse DY approaches 0. For example, if the phase of the delay pulse DY is delayed by $\Delta D$ from that of the pulse IN, the control logic 18 outputs the control signal Code that indicates a reduction of the delay amount of the VDL 12 by $\Delta D/4$. If the phase of the delay pulse DY is advanced from that of the pulse IN by $\Delta D$, the control logic 18 outputs, to the VDL 12, VDL 12M, and VDL 12N, the control signal Code that indicates an increase of the delay amount of the VDL 12 by $\Delta D/4$.

Figure 8:
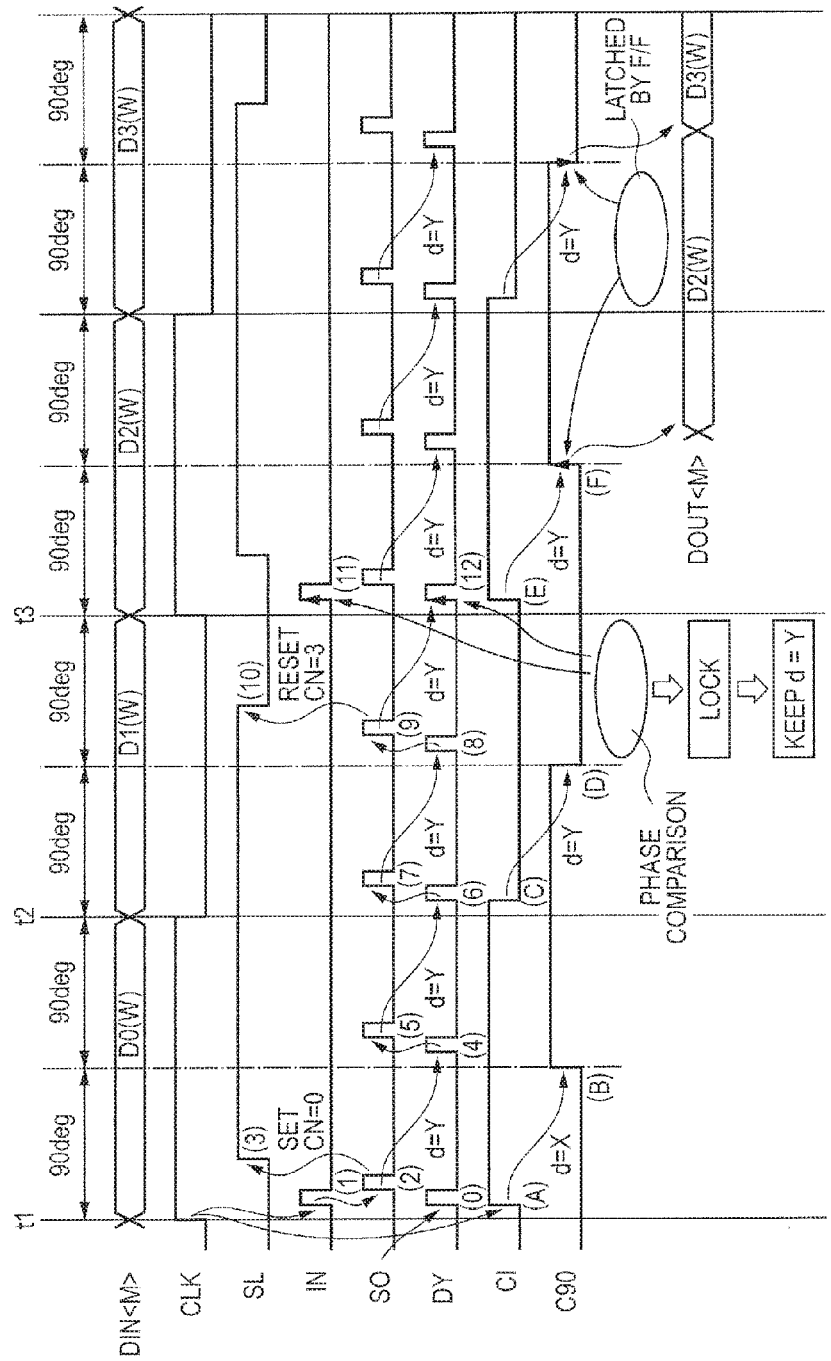
FIG. 8 is a timing chart showing the operations of a master DLL and a data lane according to the first embodiment.

FIG. 8 is a timing chart showing the operations of the master DLL 10 and the data lane 10M according to the first embodiment.

FIG. 8 shows the operations one clock before the phase comparator 17 has a phase comparison result of a predetermined value or less and the control logic 18 decides the presence of locking.

At time t1, the clock CLK rises and the data of the input data DIN<M> changes. Furthermore, the select signal SL is set at a low level and the count value CN of the counter 16 is "3".

At time t1, the pulse generator 13 generates the pulse IN (indicated at (1)) according to a rise of the clock CLK.

The selector 11M of the data lane M outputs a rise of the inputted clock CLK as arise of the reference clock CI (indicates at (A)). Moreover, the rise of the reference clock CI is delayed by a delay amount d(=X) and is outputted as a rise of the clock C90 for the data lane M (indicated at (B)).

The select signal SL at a low level causes the phase comparator 17 to compare the phase of the delay pulse DY (indicated at (0)) caused by the previous cycle and the phase of the pulse IN (indicated at (1)) and outputs a phase difference to the control logic 18.

The control logic 18 decides the absence of locking and continues DLL processing because the phase difference exceeds a predetermined value. The control logic 18 outputs the control signal Code for setting a delay amount d of the VDLs 12, 12M, and 12N at Y.

After that, the select signal SL at a low level causes the selector 15 to select the pulse IN (1) and outputs the pulse as the pulse SO (indicated at (2)).

The count value CN of the counter 16 is updated to "0" based on the generated pulse SO (indicated at (2)). Thus, the counter 16 sets the select signal SL at a high level (indicated at (3)). The generated pulse SO (indicated at (2)) is transmitted to the VDL 12 and then the VDL 12 outputs the delay pulse DY (indicated at (4)) that is delayed by Y.

Subsequently, the select signal SL at a high level causes the selector 15 to select the delay pulse DY (indicated at (4)) and outputs the pulse as the pulse SO (indicated at (5)). The count value CN of the counter 16 is updated to "1" based on the generated pulse SO (indicated at (5)).

At time t2, the clock CLK falls.

The selector 11M of the data lane M outputs a fall of the inputted clock CLK as a fall of the reference clock CI (indicated at (C)). Furthermore, the VDL 12M delays the fall of the reference clock CI by the delay amount d(=Y) and then outputs the fall as a fall of the clock C90 for the data lane M (indicated at (D)).

The generated pulse SO (indicated at (5)) is transmitted to the VDL 12 and then the VDL 12 outputs the delay pulse DY (indicated at (6)) delayed by Y.

Subsequently, the select signal SL at a high level causes the selector 15 to select the delay pulse DY (indicated at (6)) and outputs the pulse as the pulse SO (indicated at (7)).

The count value CN of the counter 16 is updated to "2" based on the generated pulse SO (indicated at (7)). The generated pulse SO (indicated at (7)) is transmitted to the VDL 12 and then the VDL 12 outputs the delay pulse DY (indicated at (8)).

Subsequently, the select signal SL at a high level causes the selector 15 to select the delay pulse DY (indicated at (8)) and outputs the pulse as the pulse SO (indicated at (9)).

The count value CN of the counter 16 is updated to "3" based on the generated pulse SO (indicated at (9)). Thus, the counter 16 sets the select signal SL at a low level (indicated at (10)).

At time t3, the clock CLK rises and the data of the input data DIN<N> changes.

At time t3, the pulse generator 13 generates the pulse IN (indicated at (11)) according to a rise of the clock CLK.

The generated pulse SO (indicated at (9)) is transmitted to the VDL 12 and then the VDL 12 outputs the delay pulse DY (indicated at (12)) delayed by Y.

Since the select signal SL is set at a low level, the phase comparator 17 compares the phase of the delay pulse DY (indicated at (12)) and the phase of the pulse IN (indicated at (11)) and outputs a phase difference to the control logic 18.

The control logic 18 decides the presence of locking and keeps the delay amount d(=Y) of the VDL 12 because the phase difference is not larger than the predetermined value.

The control logic 18 outputs the control signal Code for fixing the delay amount d of the VDLs 12, 12M, and 12N at Y to the VDL 12, VDL 12M, and VDL 12N.

The selector 11M of the data lane M outputs a fall of the clock CLK as a fall of the reference clock CI (indicated at (E)). Moreover, the VDL 12M delays the fall of the reference clock CI by the delay amount d(=Y) and outputs the fall as a fall of the clock C90 for the data lane M (indicated at (F)).

The flip-flop 13M latches the write data D2(W), which is the input data DIN<M>, according to a rise of the clock C90 for the data M and outputs the data as output data DOUT<M>.

Moreover, the flip-flop 13M latches the write data D3(W), which is the input data DIN<M>, according to a fall of the clock C90 for the data M and outputs the data as the output data DOUT<M>.

Figure 9:
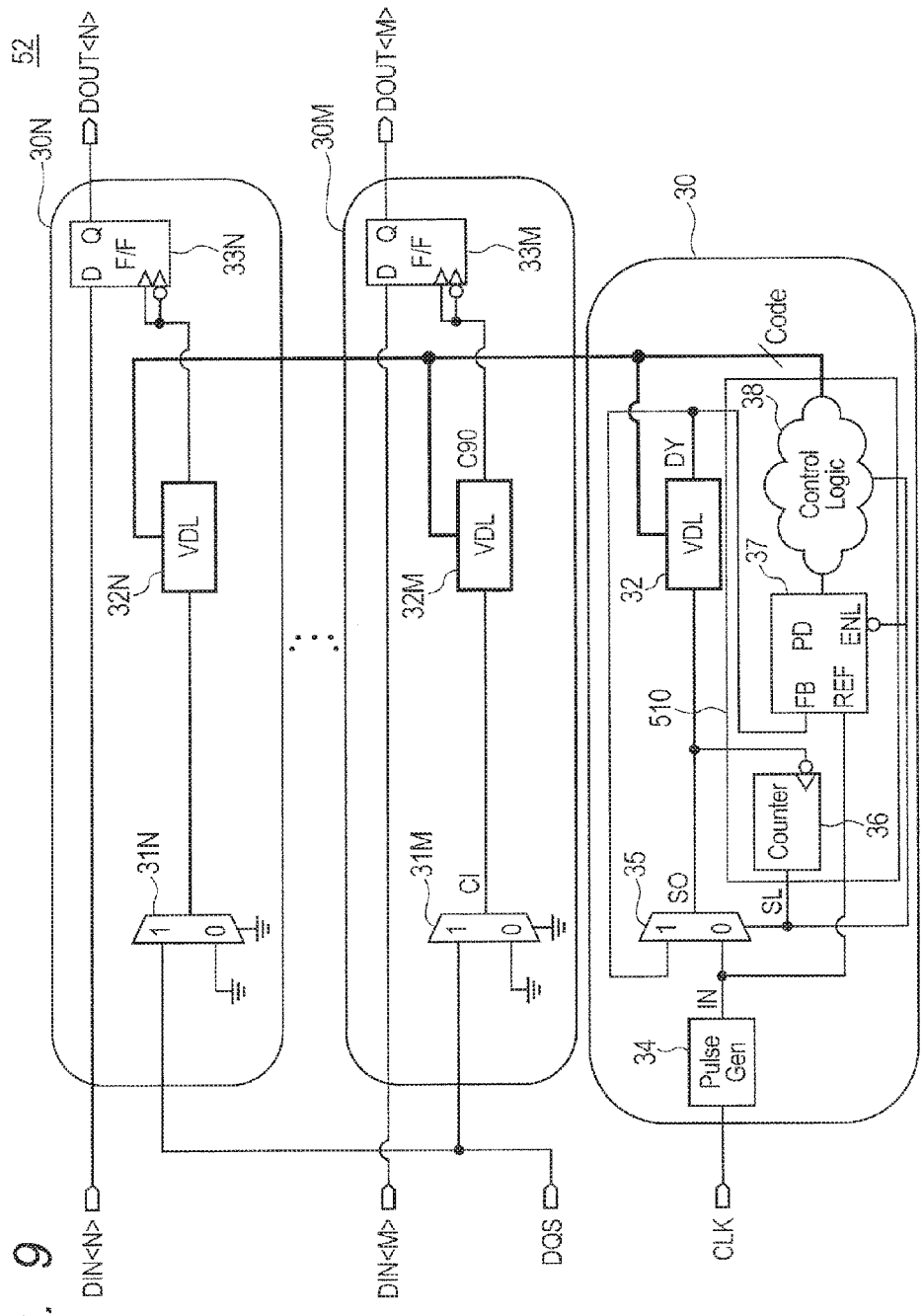
FIG. 9 shows the configuration of a read DLL circuit according to the second embodiment.

FIG. 9 shows the configuration of a read DLL circuit according to the second embodiment.

The read DLL circuit 52 includes a master DLL 30 and a plurality of data lanes.

In FIG. 9, the data lanes are typified by two data lanes 30M and 30N.

The data lanes 30M and 30N respectively include selectors 31M and 31N, VDLs 32M and 32N, and flip-flops 33M and 33N. The selectors 31M and 31N, the flip-flops 33M and 33N, and the VDLs 32M and 32N have the same functions as the selectors 11M and 11N, the VDLs 12M and 12N, and the flip-flops 13M and 13N that are included in the write DLL circuit 51. However, the selectors 31M and 31N receive the data strobe signal DQS instead of the clock CLK.

The master DLL 30 includes a pulse generator 34, a selector 35, a control circuit 510, and a VDL 32. The control circuit 510 includes a counter 36, a phase comparator 37, and a control logic 38.

The pulse generator 34, the selector 35, the counter 36, the phase comparator 37, the control logic 38, and the VDL 32 have the same functions as the pulse generator 14, the selector 15, the counter 16, the phase comparator 17, the control logic 18, and the VDL 12 that are included in the write DLL circuit 51.

The VDL 32M and VDL 32N of the data lanes 30M and 30N delay the data strobe signal DQS, whereas the VDL 32 of the master DLL 30 delays the clock CLK. This is because the clock CLK and the data strobe signal DQS have the same frequency. In the master DLL 30, a quarter time is specified for the period T of the clock CLK and is set as a delay time for the VDL 32M and the VDL 32N. Thus, the data strobe signal DQS can be delayed by a quarter time of the period T of the clock CLK.

As described above, the present embodiment allows the signal to pass through the single variable delay circuit four times as in the first embodiment. Thus, a delay amount equivalent to a quarter of the clock period is set for the variable delay circuit. This can reduce the circuit area and power consumption as in the first embodiment.

As described in the embodiment, the present invention can be used for a circuit that sets a delay amount equivalent to a quarter of the clock period in the DDR interface, that is, a timing adjustment circuit other than a 90° phase adjustment circuit.

[Modification of the Second Embodiment]

In the second embodiment a high clock frequency may cause a delay in phase comparison and changing the control signal Code. In the modification, one period is used for a phase comparison and changing of the control signal Code.

Figure 10:
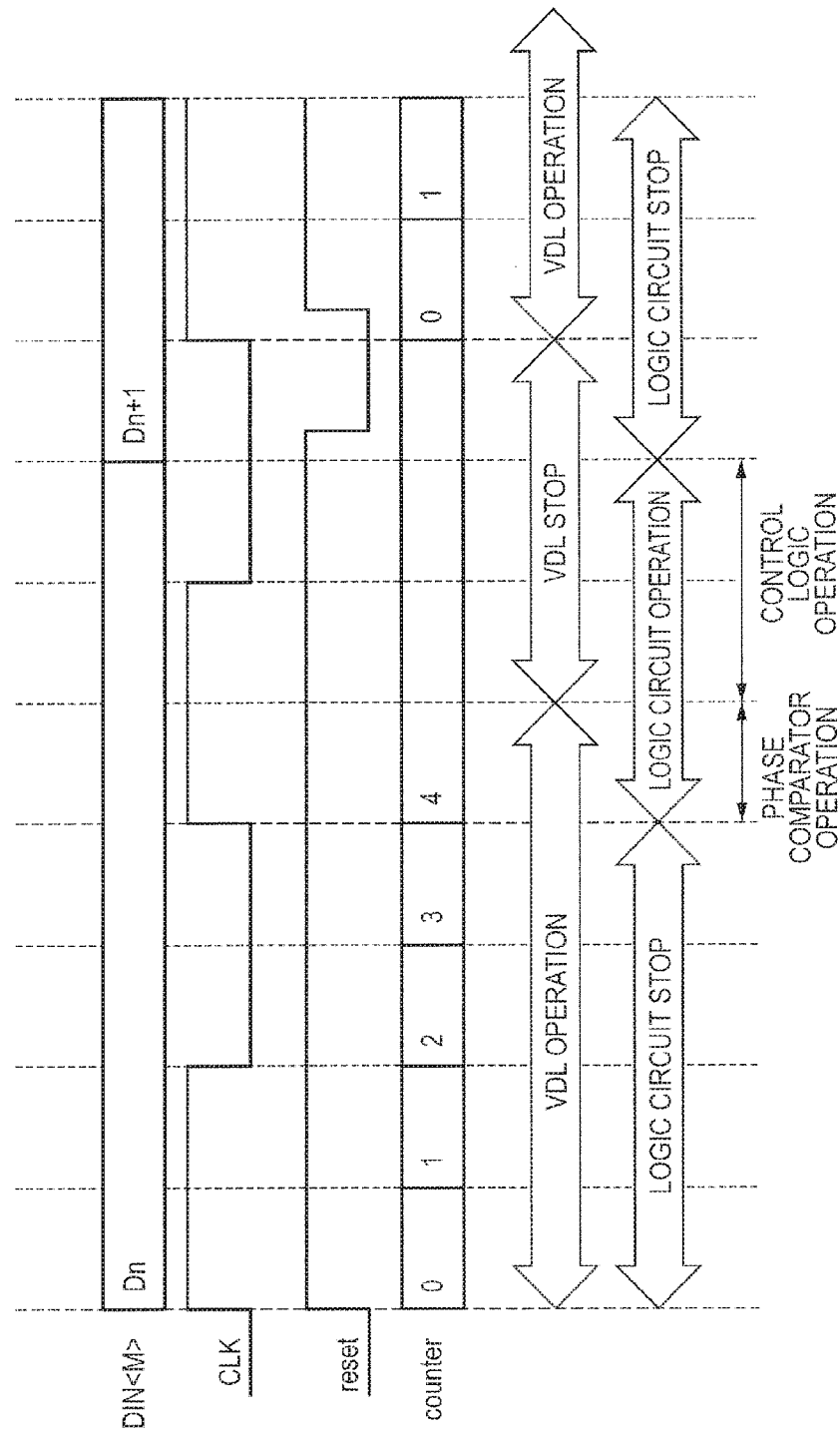
FIG. 10 is an explanatory drawing showing the operation period of a logic circuit (a phase comparator and a control logic) and the operation period of a VDL.

FIG. 10 is an explanatory drawing showing the operation period of a logic circuit (the phase comparator and the control logic) and the operation period of the VDL.

When the count value CN of the counter 16 ranges from 0 to 3, the VDL 32 is operated while a phase comparison of the phase comparator 37 and a logic operation of the control logic 38 are stopped.

When the count value CN of the counter 16 is 4, the VDL 32 is operated and the phase comparator 37 performs a phase comparison.

After that, the VDL 32 is stopped and the control logic 38 performs a logic operation.

Subsequently, the operation of the control logic 38 is also stopped. A value indicated by the control signal Code stored in the register of the control logic 38 is changed; meanwhile, a reset signal reset changed to a low level resets circuits other than the register of the control logic 38 in the master DLL 30 and also changes the count value CN of the counter 16 to 0.

In this way, a period is provided during which the VDL is stopped and a delay amount is set by the control logic, thereby avoiding a delay in processing even if the clock has a high frequency.

[Third Embodiment]

The present embodiment relates to a DLL circuit that provides different delay amounts for data lanes. In the second embodiment, a delay amount set by the master DLL 30 is set for the VDLs of all the data lanes and the VDL of the master DLL 30. However, if the VDL of the master DLL 30 has a different characteristic from that of the data lane, the delay amount of the VDL of the data lane cannot be properly set.

In the present embodiment, each data lane has a configuration for setting the delay amount of a VDL.

Figure 11:
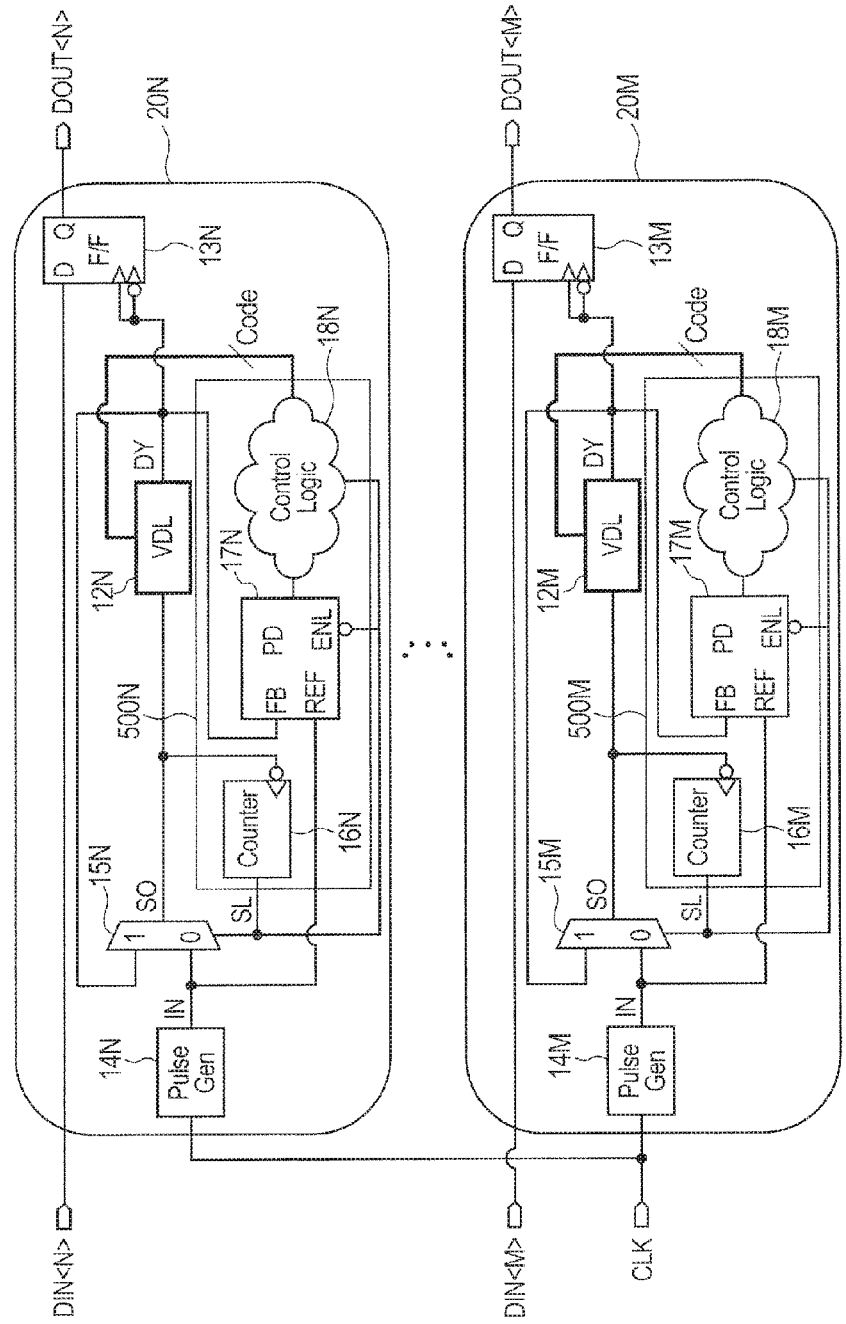
FIG. 11 shows the configuration of a write DLL circuit according to a third embodiment.

FIG. 11 shows the configuration of a write DLL circuit according to a third embodiment.

As in the second embodiment, data lanes 20M and 20N respectively include VDLs 12M and 12N and flip-flops 13M and 13N.

The data lanes 20M and 20N further include pulse generators 14M and 14N, selectors 15M and 15N, and control circuits 500M and 500N. The control circuits 500M and 500N include counters 16M and 16N, phase comparators 17M and 17N, and control logics 18M and 18N.

The pulse generators 14M and 14N, the selectors 15M and 15N, the counters 16M and 16N, the phase comparators 17M and 17N, and the control logics 18M and 18N have the same functions as the pulse generator 14, the selector 15, the counter 16, the phase comparator 17, and the control logic 18 according to the second embodiment and thus the explanation thereof is not repeated.

The third embodiment is different from the second embodiment in that the control logic 18M adjusts the delay amount of the VDL 12M in the data plane 20M while the control logic 18N adjusts the delay amount of the VDL 12N in the data plane 20N.

The present embodiment can properly set the delay amount of the VDL in each of the data lanes.

[Fourth Embodiment]

Figure 12:
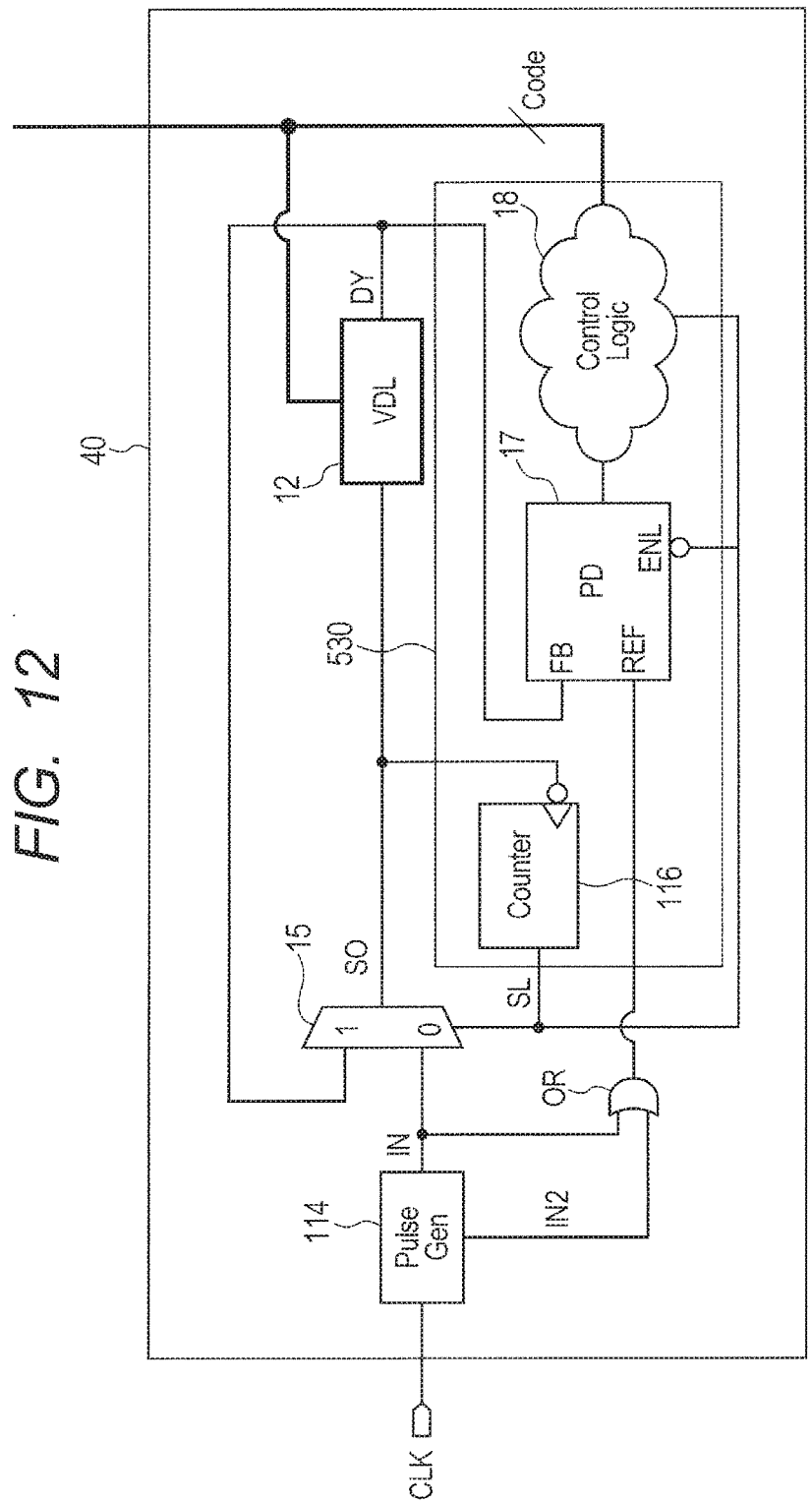
FIG. 12 shows the configuration of a master DLL 40 included in a write DLL circuit according to a fourth embodiment.

FIG. 12 shows the configuration of a master DLL 40 included in a write DLL circuit according to a fourth embodiment.

The master DLL 40 includes a selector 15, a VDL 12, a phase comparator 17, and a control logic 18 that are similar to those of the second embodiment.

The master DLL 40 includes a pulse generator 114 and a counter 116 that have different functions from those of the second embodiment, and further includes an OR circuit OR.

The pulse generator 13 of the first embodiment generates the pulse IN from a rising edge of the clock CLK, whereas a pulse generator 113 of the present embodiment generates a rising edge of a clock CLK and a pulse IN2 of the clock CLK.

The count value CN of the counter 16 according to the first embodiment ranges from 0 to 3. When the count value CN is 0, 1, or 2, the counter 16 sets the select signal SL at a high level. When the count value CN is 3, the counter 16 sets the select signal SL at a low level. In the present embodiment, a count value CN of the counter 116 ranges from 0 to 1. When the count value CN is 0, the counter 116 sets a select signal SL at a high level. When the count value CN is 1, counter 116 sets the select signal SL at a low level.

The OR circuit OR outputs the logical OR of the pulse IN and the pulse IN2 to the phase comparator 17.

Figure 13:
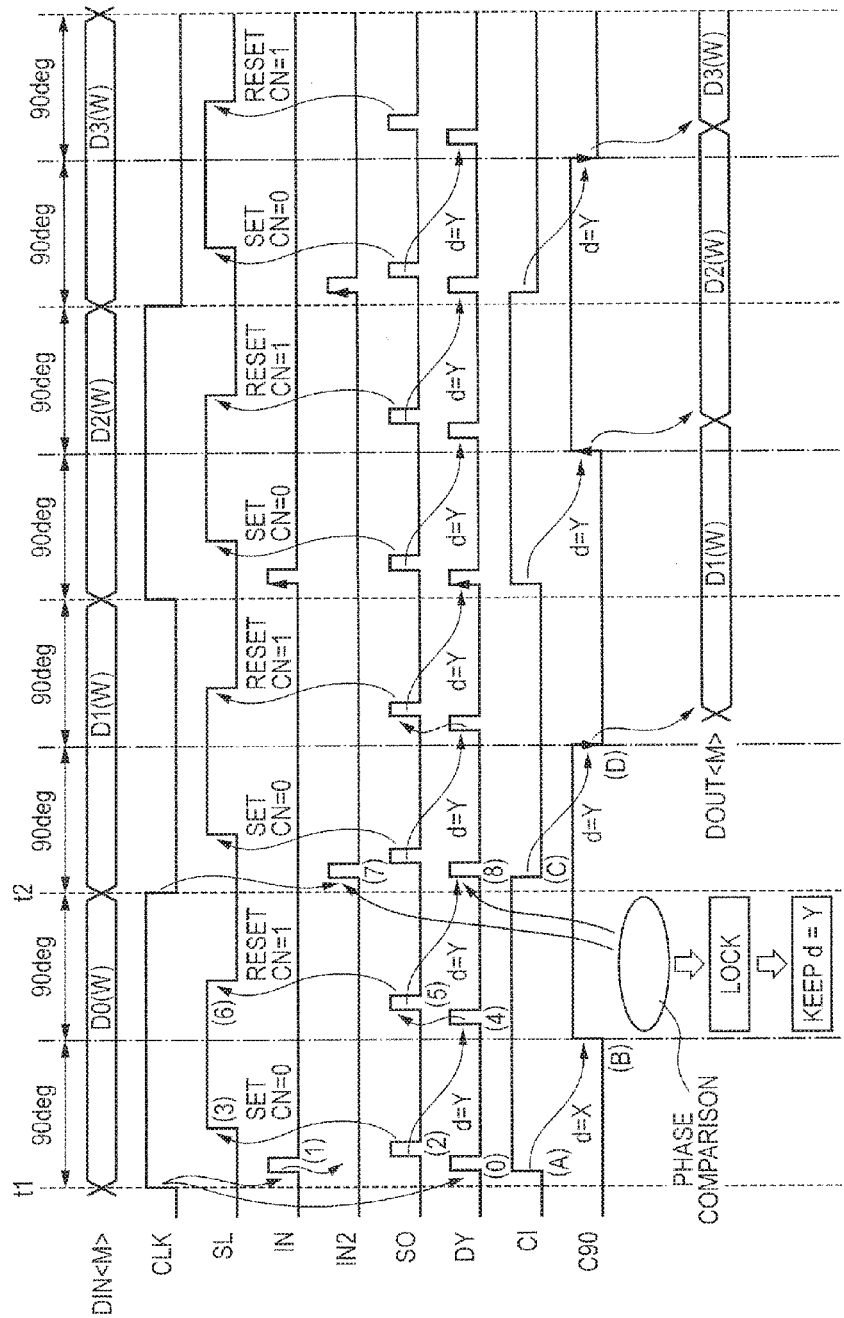
FIG. 13 is a timing chart showing the operations of the master DLL and a data lane according to the fourth embodiment.

FIG. 13 is a timing chart showing the operations of the master DLL 40 and the data lane 10M according to the fourth embodiment.

FIG. 13 shows operations one clock before the phase comparator 17 has a phase comparison result of a predetermined value or less and the control logic 18 decides the presence of locking.

At time t1, the clock CLK rises and the data of input data DIN<M> changes. Furthermore, the select signal SL is set at a low level and the count value CN of the counter 16 is "1".

At time t1, the pulse generator 113 generates the pulse IN (indicated at (1)) according to a rise of the clock CLK.

A selector 11M of a data lane 10M outputs a rise of the inputted clock CLK as a rise of a reference clock CI (indicates at (A)). Moreover, the rise of the reference clock CI is delayed by a delay amount d(=X) and is outputted as a rise of a clock C90 for the data lane 10M (indicated at (B)).

The select signal SL at a low level causes the phase comparator 17 to compare the phase of a delay pulse DY (indicated at (0)) caused by the previous cycle and the phase of the pulse IN (indicated at (1)) and outputs a phase difference to the control logic 18.

The control logic 18 decides the absence of locking and continues DLL processing because the phase difference exceeds a predetermined value. The control logic 18 outputs, to the VDL 12, the VDL 12M, and a VDL 12N, the control signal Code for setting the delay amount d of the VDLs 12, 12M, and 12N at Y.

The select signal SL at a low level causes the selector 15 to select a pulse IN(1) and outputs the pulse as a pulse SO (indicated at (2)).

The count value CN of the counter 16 is updated to "0" based on the generated pulse SO (indicated at (2)). Thus, the counter 16 sets the select signal SL at a high level (indicated at (3)). The generated pulse SO (indicated at (2)) is transmitted to the VDL 12 and then the VDL 12 outputs the delay pulse DY (indicated at (4)) that is delayed by Y.

Subsequently, the select signal SL at a high level causes the selector 15 to select the delay pulse DY (indicated at (4)) and outputs the pulse as the pulse SO (indicated at (5)). The count value CN of the counter 16 is updated to "1" based on the generated pulse SO (indicated at (5)). Thus, the counter 16 sets the select signal SL at a low level (indicated at (6)).

At time t2, the clock CLK falls.

At time t2, the pulse generator 113 generates the pulse IN2 (indicated at (7)) according to a fall of the clock CLK and outputs the pulse to the OR circuit OR.

The generated pulse SO (indicated at (5)) is transmitted to the VDL 12 and then the VDL 12 outputs the delay pulse DY (indicated at (8)) delayed by Y.

Since the select signal SL is set at a low level, the phase comparator 17 compares the phase of the delay pulse DY (indicated at (8)) and the phase of the pulse IN2 (indicated at (7)) and outputs a phase difference to the control logic 18.

The control logic 18 decides the presence of locking and keeps the delay amount d(=Y) of the VDL 12 because the phase difference is not larger than the predetermined value.

The control logic 18 outputs the control signal Code for fixing the delay amount d of the VDLs 12, 12M, and 12N at Y.

The selector 11M of the data lane 10M outputs a fall of the clock CLK as a fall of the reference clock CI (indicated at (C)). Moreover, the VDL 12M delays the fall of the reference clock CI by the delay amount d(=Y) and outputs the fall as a fall of the clock C90 for the data lane M (indicated at (D)).

The flip-flop 13M latches write data D1(W), which is the input data DIN<M>, based on a fall of the clock C90 for data M and outputs the data as output data DOUT<M>.

As described above, according to the present embodiment, the phase comparator compares the delay pulse using both of the pulse generated from a rising edge of the clock and the pulse generated from a falling edge of the clock. This can reduce a phase comparison interval to a half of that of the first embodiment.

[Fifth Embodiment]

The DLL circuit used for timing generation in the circuit block according to the first to fourth embodiments may be also applicable to means for measuring a delay time and so on.

In the present embodiment, a DLL circuit for TDR (Time Domain Reflectometry) measurement.

Figure 14:
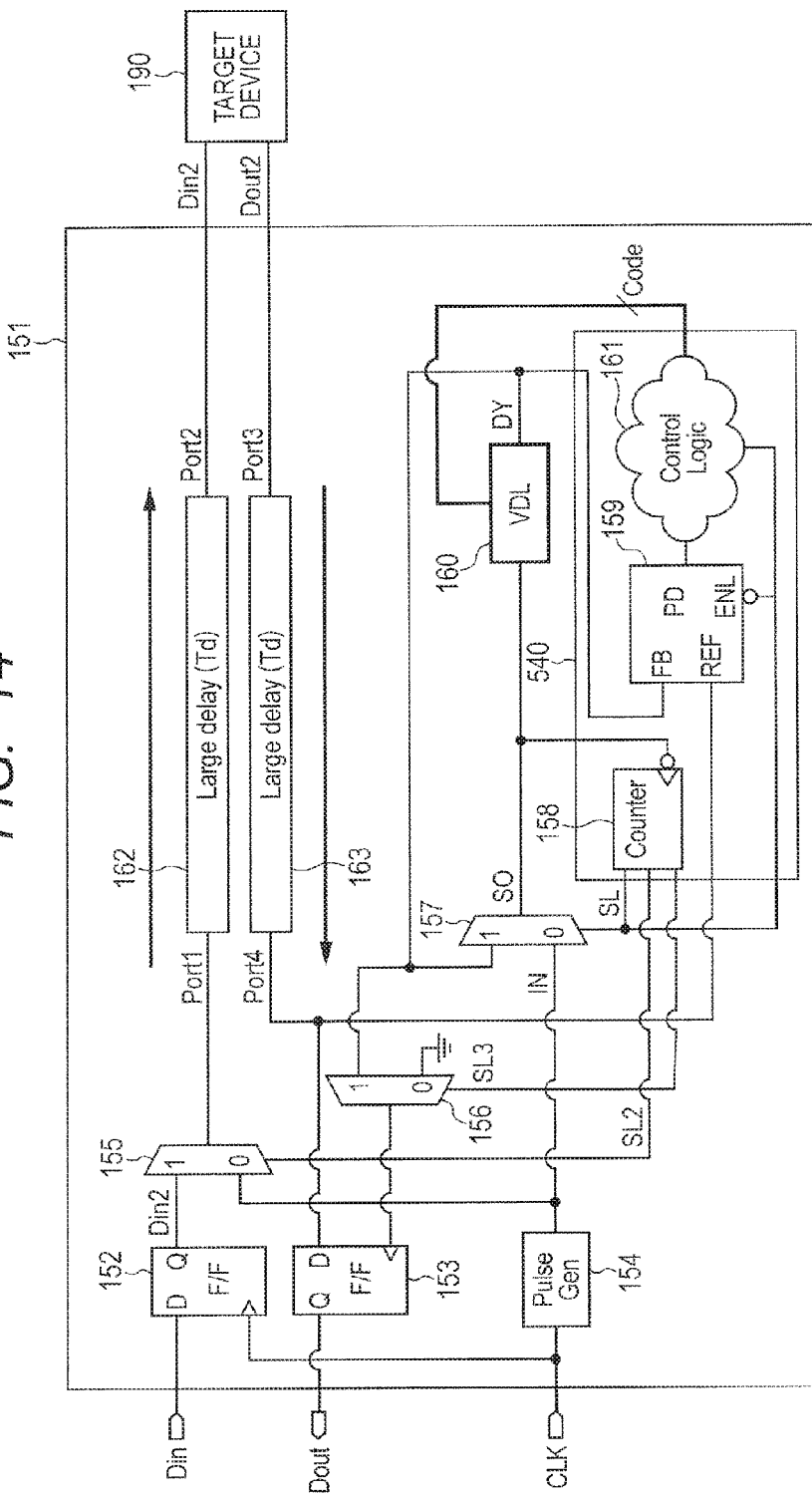
FIG. 14 shows the configuration of an input/output buffer having a TDR measuring function.

FIG. 14 shows the configuration of an input/output buffer 151 having a TDR measuring function.

The input/output buffer 151 is a semiconductor device that includes flip-flops 152 to 154, selectors 155 to 157, a VDL 160, a transmit data path 162, a receive data path 163, and a control circuit 540. The control circuit 540 includes a counter 158, a phase comparator 159, and a control logic 161.

The selectors 155 to 157 are controlled by select signals SL, SL2, and SL3.

FIG. 15 shows a state of the select signals SL, SL2, and SL3 during data writing, data reading, and TDR measurement.

The select signal SL2 is set at a high level ("1") during data writing. The select signals SL and SL3 are set at *(Don't Care).

During data writing, the select signals SL, SL2, and SL3 are set at a low level ("0"), a high level ("1"), and a high level ("1"), respectively.

During TDR measurement, the select signal SL is variably set at a low level (indicated at "0") or a high level (indicated at "1"). The select signals SL2 and SL3 are both set at a low level ("0").

(Operations in Data Writing)

Written data inputted to a terminal Din is inputted to the flip-flop 152. The flip-flop 152 latches the written data in response to a rise of a clock CLK and outputs the data as data Din2.

The select signal SL2 at a high level causes the selector 155 to output the data Din2 to a terminal port Port1 of the transmit data path 162. The data Din2 is transmitted through the transmit data path 162. The data Din2 outputted from a terminal Port2 is outputted to a target device 190.

(Operations in Data Reading)

Data Dout2 outputted from the target device 190 is transmitted to a terminal Port3 of the receive data path 163. The data Dout2 is transmitted through the receive data path 163. The data Dout2 outputted from a terminal Port4 is transmitted to the flip-flop 153.

The pulse generator 154 generates a pulse IN based on a rise of the clock CLK. The select signal SL set at a low level causes the selector 157 to output the pulse IN as a pulse SO. The VDL 160 delays the pulse SO and outputs a delay pulse DY. The select signal SL3 set at a high level causes the selector 156 to select the delay pulse DY and outputs the pulse to the flip-flop 153.

The flip-flop 153 latches the data Dout2 in response to a rise of the delay pulse DY and outputs the data as data Dout. The selector 155 does not output the pulse IN because the select signal SL2 is set at a high level. The selector 155 does not output write data because the write data is not inputted to the terminal Din.

(Operations in TDR Measurement)

Figure 16:
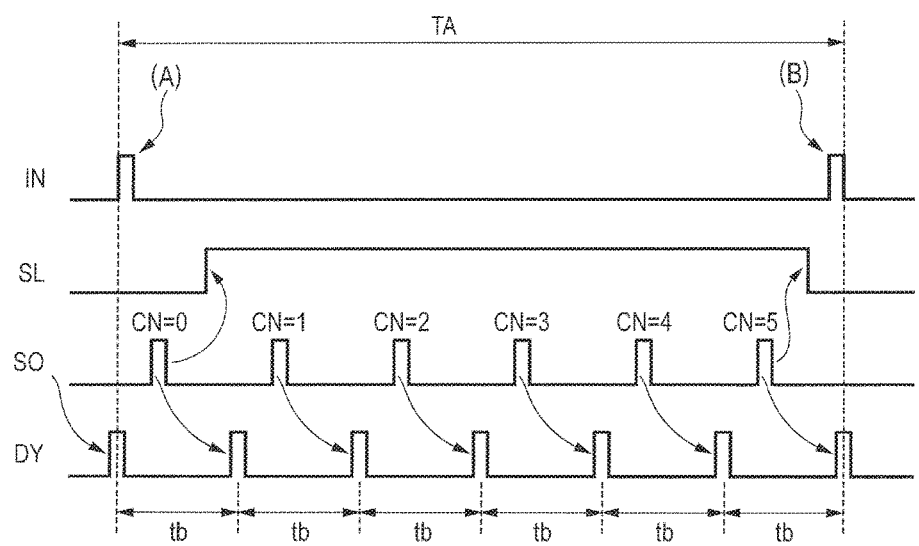
FIG. 16 is a timing chart showing operations during TDR measurement.

FIG. 16 is a timing chart showing operations during TDR measurement.

The pulse generator 154 generates the pulse IN based on a rise of the clock CLK (indicated at (A) in FIG. 16).

The select signal SL2 set at a low level causes the selector 155 to output the pulse IN to the terminal Port1 of the transmit data path 162. The pulse IN is transmitted through the transmit data path 162. The pulse IN outputted from the terminal Port2 is outputted to the target device 190.

The pulse IN returned from the target device 190 is transmitted to the terminal Port3 of the receive data path 163. The pulse IN is transmitted through the receive data path 163. The data Dout2 outputted from the terminal Port4 is transmitted to the flip-flop 153 and the phase comparator 159.

Since the select signal SL is first set at a low level, the selector 157 outputs the pulse IN as the pulse SO. The VDL 160 delays the pulse SO and outputs the delay pulse DY. After that, the select signal SL changes to a high level. The counter 158 has a count value ranging from 0 to 5.

Subsequently, the selector 157 repeatedly selects the delay pulse DY, the counter 158 repeatedly updates the count value, and the delay pulse DY generated by the VDL 160 is continuously transmitted to the selector 157.

When the count value of the counter 158 reaches "5", the counter 158 sets the select signal SL at a low level. When the select signal SL is set at a low level, the phase comparator 159 compares a phase difference between the delay pulse DY outputted from the VDL 160 and the pulse IN transmitted from Port4 of the receive data path 163 (indicated at (B) in FIG. 16). If the phase difference is larger than a predetermined value, the control logic 161 changes the delay time of the VDL 160 and the processing is repeated.

If the phase difference is not larger than the predetermined value, a time difference TA is expressed by 6×tb between the time when the pulse generator 154 generates the pulse IN (indicated at (A) in FIG. 16) and the time when the pulse IN returns from the target device 190 and is received by the phase comparator (indicated at (B) in FIG. 16).

The time difference may be regarded as the sum of the transmission time of the signal passing through the transmit data path 162, the transmission time of the signal passing through the receive data path 163, and the return time of the signal passing through the target device 190.

Moreover, tb may be regarded as the sum of a time t1 when a pulse passes through the selector 157 and a delay time t2 of the VDL 160. t1 is a known value that is determined in design. t2 is a value designed by the control logic 161. Thus, the control logic 161 determines tb from the sum of t1 and t2 and then determines TA by multiplying tb by 6.

Since the select signal SL3 is set at a low level, the selector 156 outputs a low-level signal and the flip-flop 153 does not capture the pulse IN outputted from the receive data path 163.

As described above, according to the present embodiment, the sum of the transmission time of the signal passing through the transmit data path, the transmission time of the signal passing through the receive data path, and the return time of the signal from the target device can be determined by the single variable delay circuit during TDR measurement. This can reduce the circuit area and power consumption.

The invention made by the inventors was specifically described according to the embodiments. As a matter of course, the present invention is not limited to these embodiments and can be changed in various ways without departing from the scope of the invention.

What is claimed is:

1. A method for adjusting a delay amount of a first variable delay circuit, comprising the steps of:
    (a) generating a first pulse and a second pulse at a time subsequent to the first pulse;
    (b) selecting the first pulse as an input for the first variable delay circuit;
    (c) selecting an output from the first variable delay circuit as the input for the first variable delay circuit; and
    (d) adjusting the delay amount of the first variable delay circuit so as to synchronize an output pulse in the output of the first variable delay circuit with the second pulse after a repetition number of step (c) more than 2, wherein step (d) comprises the step of (d1) comparing a phase of the second pulse and a phase of the output pulse from the first variable delay circuit; and
    (e) selecting the second pulse as an input for the first variable delay circuit based on the repetition number of step (c):
        wherein the second pulse is a pulse subsequent to the first pulse.

2. A method according to claim 1,
    wherein the first pulse and the second pulse are pulse trains based on an edge of a clock.

3. A method according to claim 1, wherein:
    the step (d) further comprises the step of (d2) setting the delay amount of the first variable delay circuit based on a result of the comparing the phase of the second pulse and the phase of the output pulse from the first variable delay circuit.

4. A method according to claim 3, wherein:
    the step (a) further comprises the step of (a1) generating the first pulse based on a rising edge of a first clock and the second pulse based on a falling edge of a second clock; and
    the step (d) further comprises the step of (d2) transmitting the second pulse and then comparing the phase of the second pulse and the phase of the output pulse from the first variable delay circuit.

5. A method according to claim 2,
    wherein the repetition number of the step (c) is 4.

6. A method according to claim 5 in a plural variable delay circuit,
    wherein a second variable delay circuit receives the clock, and
    wherein further comprising the step of (f) adjusting a delay amount of the second variable delay circuit at the delay amount of the first variable delay circuit.

7. A method according to claim 5 in a plural variable delay circuit,
    wherein a second variable delay circuit receives a second clock; and
    wherein further comprising the step of (g) setting a delay amount of the second variable delay circuit at the delay amount of the first variable delay circuit.

8. A method according to claim 3, wherein the delay amount of the first variable delay circuit is held during a period when the first variable delay circuit is stopped.

9. A method for measuring a TDR, comprising the steps of:
    (a) generating a pulse and outputting the pulse to a transmit data path;
    (b) transmitting a first output pulse from the transmit data path to a receive data path;
    (c) selecting the pulse as an input to a variable delay circuit;
    (d) selecting an output of the variable delay circuit as the input to the variable delay circuit; and
    (e) adjusting a delay amount of a variable delay circuit so as to synchronize an output pulse in the output of the variable delay circuit with a second output pulse outputted from the receive data path after a repetition number of step (d) more than 2, wherein step (e) comprises the step of comparing a phase of the second output pulse and a phase of the output pulse from the first variable delay circuit;
        wherein the second output pulse is a pulse subsequent to the first output pulse.

* * * * *